US009709225B2

(12) United States Patent
Stoll et al.

(10) Patent No.: US 9,709,225 B2
(45) Date of Patent: Jul. 18, 2017

(54) LIGHTING DEVICE FOR GENERATING A LIGHT EMISSION AND METHOD FOR GENERATING A LIGHT EMISSION

(71) Applicant: OSRAM Opto Semiconductors GmbH, Regensburg (DE)

(72) Inventors: Ion Stoll, Tegernheim (DE); Dominik Eisert, Regensburg (DE); Britta Göötz, Regensburg (DE); Robert Schulz, Thalmassing (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 60 days.

(21) Appl. No.: 14/430,946

(22) PCT Filed: Sep. 2, 2013

(86) PCT No.: PCT/EP2013/068078
§ 371 (c)(1),
(2) Date: Mar. 25, 2015

(87) PCT Pub. No.: WO2014/048682
PCT Pub. Date: Apr. 3, 2014

(65) Prior Publication Data
US 2015/0252963 A1    Sep. 10, 2015

(30) Foreign Application Priority Data

Sep. 28, 2012  (DE) .................. 10 2012 109 217

(51) Int. Cl.
*F21K 9/64*      (2016.01)
*F21K 99/00*    (2016.01)
(Continued)

(52) U.S. Cl.
CPC ................ *F21K 9/56* (2013.01); *F21K 9/64* (2016.08); *F21V 9/16* (2013.01); *F21V 13/02* (2013.01);
(Continued)

(58) Field of Classification Search
CPC ....... F21V 9/16; H01L 33/507; H01L 33/504; F21K 9/56
See application file for complete search history.

(56) References Cited

U.S. PATENT DOCUMENTS 8,716,729 B2   5/2014  Wiesmann et al.
8,785,951 B2   7/2014  Wirth
(Continued)

FOREIGN PATENT DOCUMENTS

CN    101569019 A    1/2009
CN    101663769 A    3/2010
(Continued)

*Primary Examiner* — Julie Bannan
(74) *Attorney, Agent, or Firm* — Slater Matsil, LLP (57) ABSTRACT

A lighting device, in various embodiments, for generating a light emission, has a light source designed to generate light with a first dominant wavelength, a first converter designed to absorb the light generated by the light source and to emit light with a second dominant wavelength, which is longer than the first dominant wavelength, and a second converter designed to absorb a portion of the light emitted by the first converter and to emit light such that the light emission has a third dominant wavelength, which is longer than the second dominant wavelength.

15 Claims, 8 Drawing Sheets

(51) Int. Cl.
  *H01L 33/50*   (2010.01)
  *F21V 9/16*    (2006.01)
  *F21V 13/02*   (2006.01)
  *H01L 33/58*   (2010.01)
  *H01L 51/50*   (2006.01)

(52) U.S. Cl.
  CPC ............ *H01L 33/504* (2013.01); *H01L 33/58* (2013.01); *H01L 33/507* (2013.01); *H01L 51/5036* (2013.01); *H01L 2933/0091* (2013.01)

(56) References Cited

U.S. PATENT DOCUMENTS

| | | | | |
|---|---|---|---|---|
| 2003/0127659 A1* | 7/2003 | Bawendi | ................ | B82Y 10/00 257/89 |
| 2004/0012027 A1* | 1/2004 | Keller | .................... | H01L 33/50 257/79 |
| 2007/0096128 A1* | 5/2007 | Fukudome | ........... | C09K 11/565 257/98 |
| 2008/0012031 A1* | 1/2008 | Jang | ........................ | C09K 11/02 257/89 |
| 2008/0180948 A1* | 7/2008 | Yoon | .................. | C09K 11/0883 362/230 |
| 2008/0211386 A1* | 9/2008 | Choi | .................... | H01L 33/504 313/503 |
| 2008/0231170 A1* | 9/2008 | Masato | ................ | C09K 11/565 313/501 |
| 2009/0152582 A1* | 6/2009 | Chang | .................. | H01L 33/507 257/98 |
| 2010/0044735 A1* | 2/2010 | Oyamada | ............. | H01L 33/504 257/98 |
| 2010/0142182 A1* | 6/2010 | Van Woudenberg | ......................... | G02F 1/133603 362/84 |
| 2011/0006323 A1* | 1/2011 | Suzuki | .................. | H01L 33/504 257/98 |
| 2011/0019707 A1* | 1/2011 | Sato | ..................... | H01L 33/504 372/45.01 |
| 2011/0049551 A1 | 3/2011 | Wiesmann et al. | | |
| 2011/0068322 A1 | 3/2011 | Pickett et al. | | |
| 2011/0156071 A1* | 6/2011 | Cheng | .................... | H01L 33/44 257/98 |
| 2011/0273079 A1* | 11/2011 | Pickard | ................. | H01L 33/504 313/483 |
| 2012/0007130 A1* | 1/2012 | Hoelen | ................. | H01L 33/504 257/98 |
| 2012/0119639 A1 | 5/2012 | Staats et al. | | |
| 2012/0217865 A1* | 8/2012 | Cabalu | ..................... | H01J 1/63 313/483 |
| 2013/0070448 A1* | 3/2013 | Galvez | ..................... | F21K 9/54 362/230 |
| 2013/0187537 A1* | 7/2013 | Hikmet | ................ | C09K 11/06 313/504 |
| 2013/0208442 A1* | 8/2013 | Reiherzer | ................ | F21K 9/56 362/84 |
| 2013/0235555 A1* | 9/2013 | Tanaka | ..................... | F21V 9/16 362/84 |
| 2013/0267051 A1 | 10/2013 | Petersen | | |
| 2013/0294048 A1 | 11/2013 | Asano et al. | | |
| 2014/0333199 A1* | 11/2014 | Wang | ....................... | F21K 9/56 313/512 |
| 2015/0117013 A1* | 4/2015 | Hikmet | ................. | H01J 61/44 362/293 |

FOREIGN PATENT DOCUMENTS

| | | |
|---|---|---|
| CN | 102378801 A | 3/2012 |
| DE | 102008015941 A1 | 6/2009 |
| DE | 102010012040 A1 | 9/2011 |
| DE | 102010054280 A1 | 6/2012 |
| JP | 2011114097 A | 6/2011 |
| JP | 2012501529 A | 1/2012 |
| JP | 2012163936 A | 8/2012 |
| JP | 2012523115 A | 9/2012 |
| WO | 2008068689 A1 | 6/2008 |
| WO | 2010116294 A1 | 10/2010 |
| WO | 2012120434 A1 | 9/2012 |

* cited by examiner

LIGHTING DEVICE FOR GENERATING A LIGHT EMISSION AND METHOD FOR GENERATING A LIGHT EMISSION

This patent application is a national phase filing under section 371 of PCT/EP2013/068078, filed Sep. 2, 2013, which claims the priority of German patent application 10 2012 109 217.6, filed Sep. 28, 2012, each of which is incorporated herein by reference in its entirety.

TECHNICAL FIELD

The invention relates to a lighting device for generating a light emission, for example, a light-emitting diode component with a package or a light-emitting diode structure on a substrate (panel), and to a method for generating a light emission.

SUMMARY

In order to generate white light or differently colored light by means of a light-emitting diode (LED), generally a semiconductor chip, which emits narrow-band blue light, is used. For LEDs for vehicle brake-light and tail-light applications and traffic-light applications, a red-converting phosphor is used, located above (but in the light path of) the semiconductor chip of the LED. In this case, the blue light of the semiconductor chip is typically converted completely, so that only red light is emitted by the component (also referred to as full conversion).

This full conversion generally leads to a loss of efficiency of the LED, since a high phosphor content has to be used. This leads to increased scattering losses. A second problem is that the phosphors that are usually used have a broad-band emission. $Eu^{2+}$-doped phosphors with a dominant wavelength of greater than 610 nm are not currently commercially available with a high conversion efficiency.

Similarly, there is generally the problem that, to achieve a saturated shade of red (dominant wavelength of greater than 615 nm), two conflicting effects occur, with an adverse influence on the result:

Due to the broadbandedness, a red dye with a relatively long-wave dominant wavelength (greater than 615 nm) emits both in the red spectral range and in the infrared spectral range. As a result, the visual efficiency is reduced. When a short-wave red phosphor (dominant wavelength of less than 610 nm) is used, the phosphor still has a high proportion of the emitted light in the green spectral range; as a result, with a high concentration of phosphor, the dominant wavelength shifts to shortwave and the desired color range is not achieved.

To generate red light with a dominant wavelength in a range of approximately 600 nm to approximately 615 nm by means of full conversion of blue light with an $Eu^{2+}$-doped converter ($Eu^{2+}$-doped nitrides, for example, $CaAlSiN3$:$Eu^{2+}$, $(Ba, Sr)2Si5N8$:$Eu^{2+}$; $Eu^{2+}$-doped sulphides, $Eu^{2+}$-doped SiAlONe and SiONe), so much converter has to be used that the converter reabsorbs again ranges of its short-wave emission. In this way, a narrow-band emission spectrum may be obtained. However, this amount of phosphor is greater than is required just for full conversion. Due to the quantum efficiency (QE) of less than 1, this leads to losses in efficiency (in practice QE ~80-90%). Similarly, the high concentration of phosphor has disadvantageous effects, by means of scattering.

Here and hereinafter, the term "approximately" should be understood as meaning in particular that the desired numerical values are achieved exactly or exactly within the limits of the production tolerance. "Approximately" therefore means in particular "exactly or exactly within the limits of the production tolerance".

A ceramic conversion element may also be used, but in this case there are also losses in efficiency due to reabsorption.

In various exemplary embodiments, a lighting device and a method for generating a light emission are provided.

According to various embodiments, a lighting device for generating a light emission is made available, comprising a light source, a first converter and a second converter.

In various embodiments, a lighting device for generating a light emission is provided, having: a light source, configured for generating light with a first dominant wavelength; a first converter, which is configured to absorb the light generated by the light source and emit light with a second dominant wavelength, which is greater than the first dominant wavelength; and a second converter, which is configured to absorb a light component of the light emitted by the first converter and emit light such that the light emission has a third dominant wavelength, which is greater than the second dominant wavelength.

In one configuration of the lighting device, the first dominant wavelength lies in the spectral range of blue light, the first converter converts the light of the light source completely into yellowy-red light, and the second converter emits light in the long-wave range of the first converter or in the infrared range.

The complete conversion of the light of the first light source to yellowy-red light is in this case achieved within the limits of the production tolerance. This means that at least 95% of the blue light, in particular at least 98% of the blue light, for example, at least 99% of the blue light, is converted by the first converter. This means that no blue light or scarcely any blue light remains unconverted. In particular, there is then no longer any blue component perceptible to the human viewer or technical aids in the light radiated from the first converter. The first converter therefore then radiates only yellowy-red light and possibly infrared radiation. The yellowy-red light has, for example, wavelengths of between at least 580 nm and at most 650 nm.

After that, the second converter absorbs part of the yellowy-red light of the first converter. In particular, scarcely any radiation or no radiation of the light source, that is to say no blue light or scarcely any blue light, impinges on the second converter.

The second converter absorbs in particular the high-energy component of the yellowy-red light of the first converter as completely as possible or completely. The second converter absorbs in particular the yellow or yellowy component of the yellowy-red light completely. For example, the second converter absorbs electromagnetic radiation with a wavelength of between at least 580 nm and at most 615 nm, in particular at most 600 nm.

After that, the second converter re-emits electromagnetic radiation in the range of red light, for example, with a wavelength of at least 615 nm.

Altogether, in this way red light of a particularly pure color can be generated in a particularly efficient way. By the second converter, an undesired component in the spectrum of the light emitted by the first converter—the yellow or yellowy light component—is absorbed and used for generating further red light or infrared radiation. Since the second converter is only irradiated by relatively low-energy light, sensitive materials, such as, for example, organic converters and/or converters that are based on semiconductor nanoparticles, can be used for forming the second converter.

Since the first converter can be formed with a phosphor that emits light of a shorter wavelength than is otherwise necessary in the full conversion to red light, less primary radiation is converted into infrared radiation, which further increases the efficiency of the lighting device.

The first converter and the second converter are in this case formed with different phosphors. For example, the first converter is formed with a ceramic phosphor and the second converter is formed with an organic phosphor.

In one configuration, the light component may contain up to approximately 40% of the light output of the first converter.

In one configuration, the light component may contain up to approximately 30% of the light output of the first converter.

In one configuration, the light component may contain up to approximately 20% of the light output of the first converter.

In one configuration, the light component may contain up to approximately 10% of the light output of the first converter.

In one configuration, the light component may contain up to approximately 5% of the light output of the first converter.

In one configuration, the second converter may be configured to emit light with a fourth dominant wavelength, which is greater than the second dominant wavelength.

In one configuration, the second converter may be configured to absorb the light component of the light emitted by the first converter and emit light such that the light emission has a greater peak wavelength in comparison with the light emitted by the first converter.

In one configuration, the second converter may have a particle size that is smaller than the second dominant wavelength.

In one configuration, the second converter may contain an organic material.

In one configuration, the second converter may be contained in a lens of the lighting device.

In one configuration, the second converter may be arranged at least partially around a lens of the lighting device.

In one configuration, the light source may have a light-emitting diode component with a package and the package may have a cavity for receiving the second converter.

In one configuration, the second converter may be contained in a matrix material, which may be accommodated in the cavity.

In one configuration, the light source may contain a chip arranged on a substrate.

In one configuration, the first converter may be arranged on the chip.

In one configuration, the second converter may be arranged on the first converter.

In one configuration, the second converter may be arranged on the substrate offset in relation to the chip.

In one configuration, the second converter may be formed as a component that is separate from the light source and from the first converter.

In one configuration, the third dominant wavelength may be in the range from approximately 615 nm to approximately 625 nm.

In one configuration, the first converter may be configured to emit light in a wavelength range from approximately 580 nm to approximately 650 nm.

In one configuration, the second dominant wavelength may be less than 610 nm.

In various exemplary embodiments, a method for generating a light emission is provided. The method may comprise: generating light with a first dominant wavelength by a light source; absorbing the generated light and emitting light with a second dominant wavelength, which is greater than the first dominant wavelength, by a first converter; and absorbing a light component of the light emitted by the first converter and emitting light by a second converter such that the light emission has a third dominant wavelength, which is greater than the second dominant wavelength.

In one configuration, the light component may contain up to approximately 40% of the light output of the first converter.

In one configuration, the light component may contain up to approximately 30% of the light output of the first converter.

In one configuration, the light component may contain up to approximately 20% of the light output of the first converter.

In one configuration, the light component may contain up to approximately 10% of the light output of the first converter.

In one configuration, the light component may contain approximately 5% of the light output of the first converter.

In one configuration, the light emitted by the second converter may have a fourth dominant wavelength, which may be greater than the second dominant wavelength.

In one configuration, the light component of the light emitted by the first converter can be absorbed by the second converter and light emitted such that the light emission has a greater peak wavelength in comparison with the light emitted by the first converter.

In one configuration, the second converter may have a particle size that is smaller than the second dominant wavelength.

In one configuration, the second converter may contain an organic material.

In one configuration, the third dominant wavelength may be in the range from approximately 615 nm to approximately 625 nm.

In one configuration, the first converter may emit light in a wavelength range from approximately 580 nm to approximately 650 nm.

In one configuration, the second dominant wavelength may be less than approximately 610 nm.

At least some exemplary embodiments can advantageously ensure that a red-red converted spectrum with a dominant wavelength in the range from approximately 615 to approximately 625 nm is obtained.

BRIEF DESCRIPTION OF THE DRAWINGS

Exemplary embodiments of the invention are represented in the figures and explained in more detail below.

In the drawings.

DETAILED DESCRIPTION OF ILLUSTRATIVE EMBODIMENTS

In an exemplary embodiment, a blue semiconductor chip is fully converted with a red phosphor. Further along the light path there is a second converter. This converter has an absorption in the short-wave range of the emitted light of the first converter. Furthermore, the second converter has an emission in the long-wave range of the first converter or in the infrared range, for example, with a dominant wavelength that is greater than the dominant wavelength of the first converter. The second converter thus advantageously absorbs parts of the short-wave emission of the first converter and, as a result, shifts the dominant wavelength of the emission to longwave. In addition, the emission of the second converter may contribute to the long-wave shift both of the dominant wavelength and of the peak wavelength (that is to say the wavelength with the highest intensity) of the emission, and advantageously further increase the overall efficiency, in comparison with an identical wavelength shift due to an increase in concentration of the first converter.

In various exemplary embodiments, a dominant wavelength is understood as meaning the wavelength that describes the shade of color of a light-emitting device, for example, a light-emitting diode (LED), as perceived by the human eye. The dominant wavelength may also be referred to as the main wavelength, centroid wavelength or dominance wavelength.

The second converter is advantageously an organic converter. The particle size of organic converters is usually much smaller than the wavelength of light. As a result, there are advantageously no scattering losses or only small scattering losses. Organic converters usually have only low stability with respect to irradiation with short-wave visible light, that is to say with light, for example, in a range from approximately 420 nm to approximately 540 nm. These wavelengths correspond to an energy of approximately 2.3-3.1 eV, which is equivalent to weak carbon bonds (for example, carbon-carbon or carbon-halide bonds; 220-350 kJ/mol), and consequently can destroy them photochemically.

Due to the full conversion of the light emitted by the blue semiconductor chip by means of the first converter, in an exemplary embodiment the second converter is only irradiated with light in a range from approximately 580 nm to approximately 650 nm. As a result, a high stability of the lighting device can advantageously also be achieved with organic converters.

Figure 1:
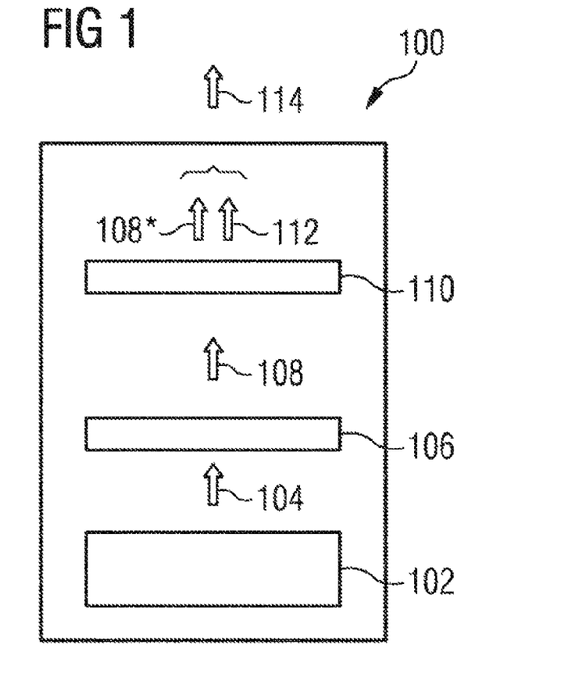
FIG. 1 shows a schematic representation of an exemplary embodiment of a lighting device for generating a light emission.

The exemplary embodiment of a lighting device 100 that is shown in FIG. 1 contains a blue light source 102, which generates light 104 with a first dominant wavelength, for example, light 104 with a first dominant wavelength in a range from approximately 380 nm to approximately 480 nm. The lighting device 100 also contains a first converter 106, which absorbs the light 104 generated by the light source, and which emits light 108 with a second dominant wavelength, which is greater than the first dominant wavelength. In various exemplary embodiments, the second dominant wavelength may lie in a range from approximately 580 nm to 650 nm, for example, in a range from approximately 580 nm to approximately 610 nm, for example, in a range from approximately 600 nm to approximately 610 nm.

The lighting device 100 also contains a second converter 110, which is configured to absorb a light component, for example, a short-wave light component, of the light 108 emitted by the first converter and emit light 112 with a wavelength that is increased in comparison with the light absorbed. For example, the second converter 110 has a dominant wavelength that is greater than the dominant wavelength of the first converter.

In various exemplary embodiments, the absorbed light component may contain up to approximately 40% of the light output of the first converter 106, advantageously up to approximately 30%, more advantageously up to approximately 20%, more advantageously up to approximately 10%, and preferably approximately 5%. The amount of absorbed light output may be influenced, for example, by one or more of the following parameters:

The length of the light path through the medium with the conversion material, the concentration of the light material and the molar extinction coefficient of the chosen conversion material (Lambert's law).

The extinction coefficient may in turn be wavelength-dependent, that is to say the amount of absorbed light output can be obtained from the superposition of the emission and the extinction. Similarly, the molar extinction coefficient may be dependent on the dielectricity of the medium.

A dominant wavelength of the light 114 that is generated overall by the lighting device 100 and is obtained from the superposition of the non-absorbed light component 108 of the first converter 106 and the light 112 emitted by the second converter 110 may be in the range from approximately 615 nm to approximately 625 nm. Advantageously, both the dominant wavelength and the peak wavelength of the light 114 are shifted to longwave with respect to the light 108 emitted by the first converter 106.

This cannot be achieved, for example, if only a component of the light emitted by the first converter were absorbed.

Figure 2:
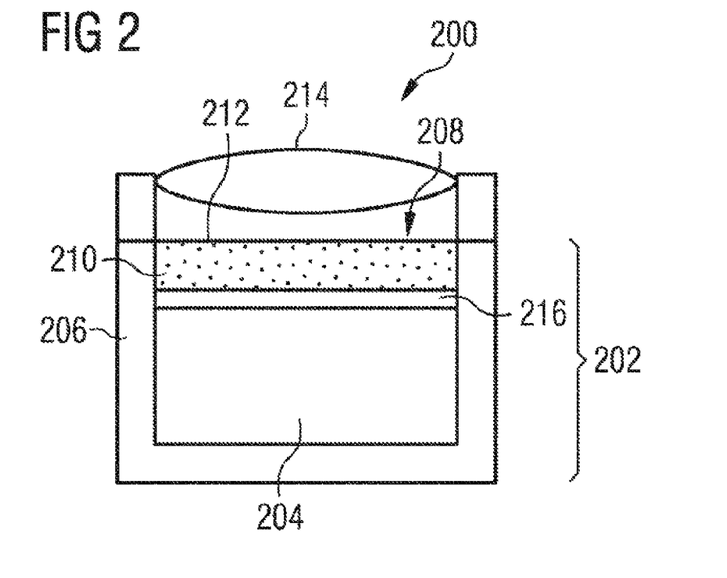
FIG. 2 shows a schematic representation of a cross section of a further exemplary embodiment of a lighting device for generating a light emission.

The exemplary embodiment of a lighting device 200 that is shown in FIG. 2 contains a light source 202, which contains a light-emitting diode (LED) component with a blue semiconductor chip 204 and a package (also referred to as a housing) 206. The package 206 has a cavity 208 for receiving the second converter 210.

In this exemplary embodiment, a first converter 216 has been applied to the semiconductor chip 204, for full conversion or virtually full conversion (blue component in the spectrum advantageously less than approximately 5%). The first converter 216 may have been applied to the semiconductor chip 204, for example, by layer transfer, volume potting, electrophoretic deposition or spray coating.

The second converter 210 may be contained in a matrix material 212 accommodated in the cavity 208. A lens 214 may be optionally mounted on the package 206 in the region of the cavity 208. In this exemplary embodiment, the cavity 208 is potted with the matrix material 212. The lens 214 may, for example, have been applied to the second converter 210 by an adhesive (for example, silicone). In other exemplary embodiments, the lens 214 may be applied as drops and the form of a lens may be formed by surface forces. In a further exemplary embodiment, the lens 214 may be formed by shaping methods such as molding or casting.

In the case of structures other than those obtained by volume potting, this matrix may contain the second converter (for example, an organic converter or semiconductor nanoparticle). In the case of volume potting, separation of the first converter and the second converter would not be ensured.

Figure 3:
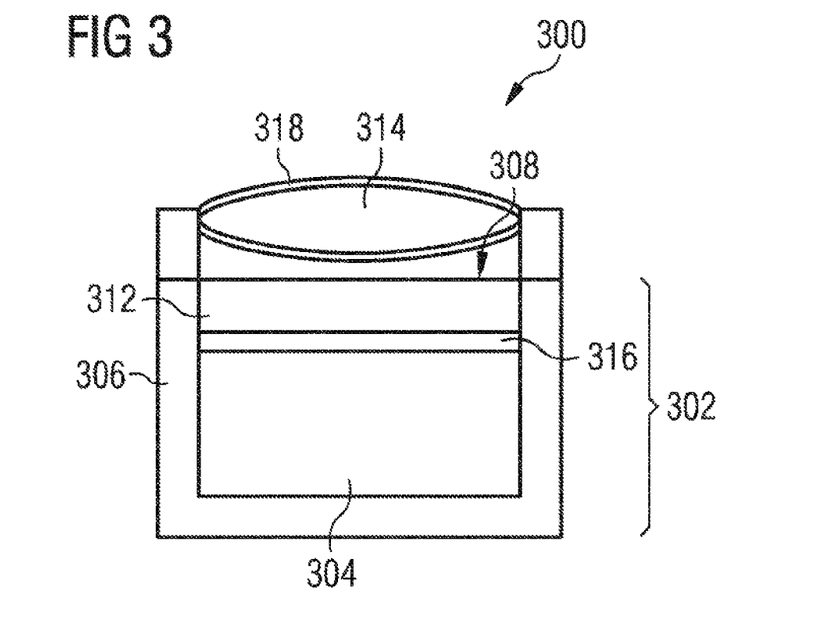
FIG. 3 shows a schematic representation of a cross section of a further exemplary embodiment of a lighting device for generating a light emission.

The exemplary embodiment of a lighting device 300 that is shown in FIG. 3 contains a light source 302, which has a light-emitting diode component with a blue semiconductor chip 304 and a package 306. A matrix material 312 is accommodated in a cavity 308 of the package 306. In this exemplary embodiment, the cavity 308 is potted with the matrix material 310. A lens 314 may be mounted on the package 306 in the region of the cavity 308.

In this exemplary embodiment, a first converter 316, configured for full conversion or virtually full conversion (blue component in the spectrum advantageously less than approximately 5%), has been applied to the semiconductor chip 304. The first converter 316 may have been applied to the semiconductor chip 304, for example, by layer transfer, volume potting, electrophoretic deposition or spray coating.

A second converter 318 is arranged at least partially around the lens 314 or encloses the lens 314 substantially completely, as shown in the exemplary embodiment represented in FIG. 3. In this exemplary embodiment, the material of the second converter 318 has been applied, for example, molded, in the form of a shell around the lens 314.

Figure 4:
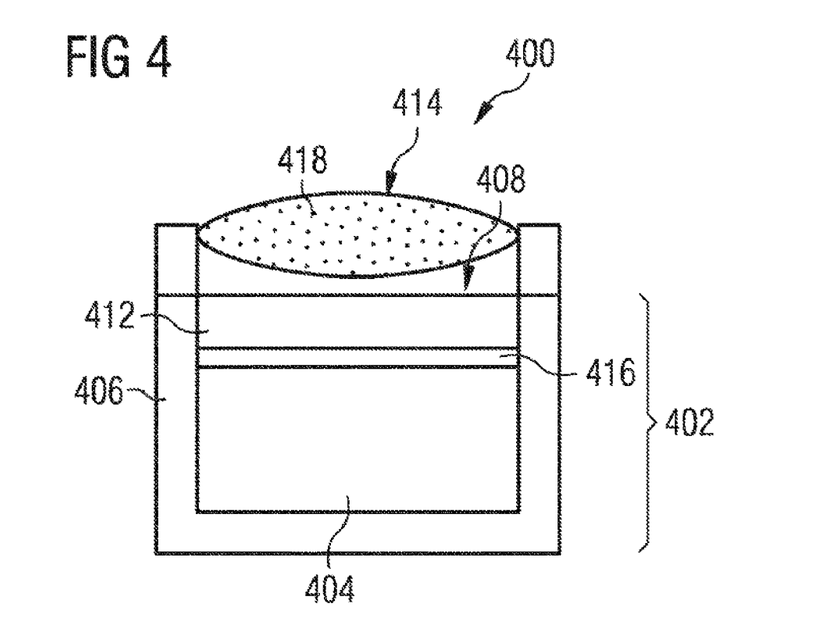
FIG. 4 shows a schematic representation of a cross section of a further exemplary embodiment of a lighting device for generating a light emission.

The exemplary embodiment of a lighting device 400 that is shown in FIG. 4 contains a light source 402, which contains a light-emitting diode component with a blue semiconductor chip 404 and a package 406. A matrix material 412 is accommodated in a cavity 408 of the package 406. In this exemplary embodiment, the cavity 408 is potted with the matrix material 410. A lens 414 is mounted on the package 406 in the region of the cavity 408.

In this exemplary embodiment, a first converter 416, configured for full conversion or virtually full conversion (blue component in the spectrum advantageously less than approximately 5%), has been applied to the semiconductor chip 404. The first converter 416 may have been applied to the semiconductor chip 404, for example, by layer transfer, volume potting, electrophoretic deposition or spray coating. The material of a second converter 418 is contained in the lens 414.

Figure 5:
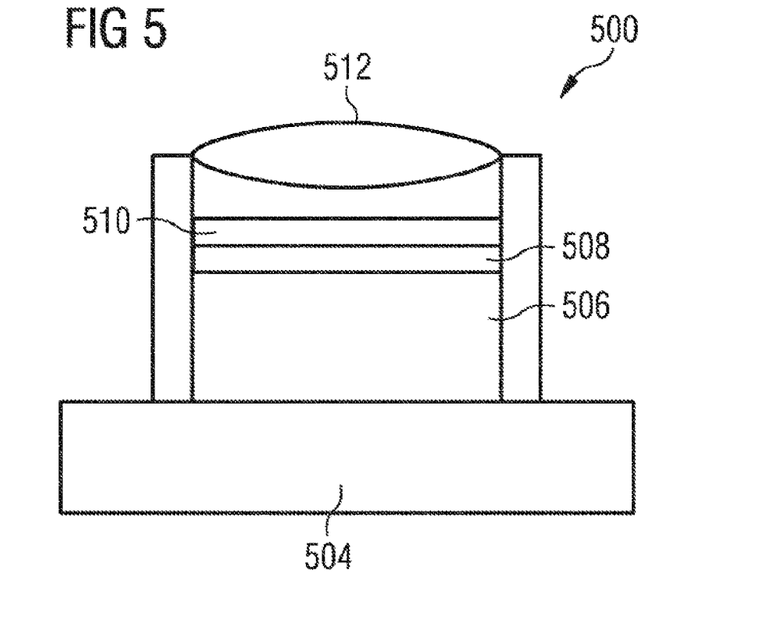
FIG. 5 shows a schematic representation of a cross section of a further exemplary embodiment of a lighting device for generating a light emission.

The exemplary embodiment of a lighting device 500 that is shown in FIG. 5 contains a light source, which contains a blue semiconductor chip 506 (for example, a light-emitting diode chip) arranged on a substrate 504. A first converter 508 is arranged on the chip 506 and a second converter 510 is arranged on the first converter 508. A lens 512 may be mounted over the first converter 508. The first converter 508 may be applied to the substrate 504, for example, by layer transfer, electrophoretic deposition or spray coating, for full conversion or virtually full conversion. The lens 512 may, for example, have been molded onto the substrate 504.

Figure 6:
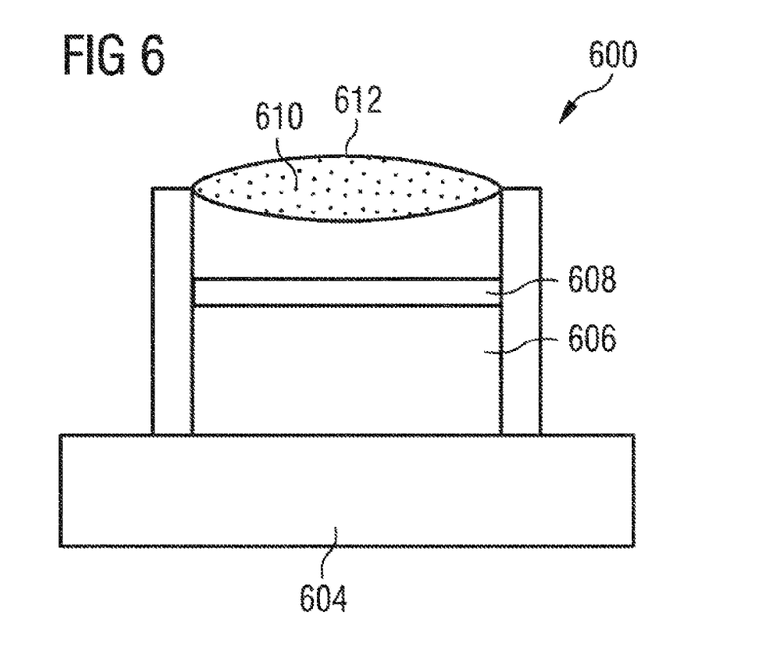
FIG. 6 shows a schematic representation of a cross section of a further exemplary embodiment of a lighting device for generating a light emission.

The exemplary embodiment of a lighting device 600 that is shown in FIG. 6 contains a light source, which has a blue semiconductor chip 606 (for example, a light-emitting diode chip) arranged on a substrate 604. A first converter 608 is arranged on the chip 606 and a lens 612 may be mounted over the first converter 608. The material of a second converter 610 may be contained in the lens 612.

Figure 7:
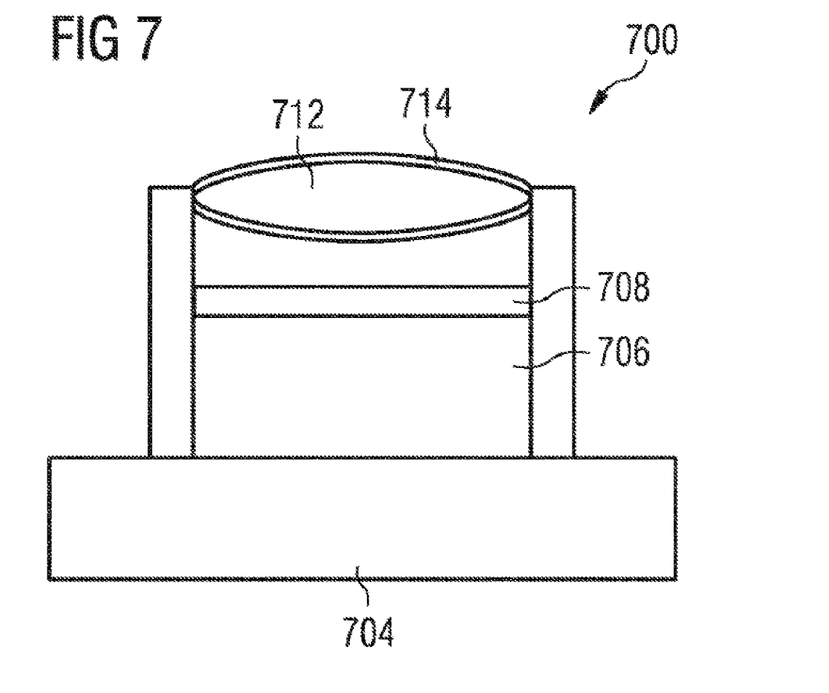
FIG. 7 shows a schematic representation of a cross section of a further exemplary embodiment of a lighting device for generating a light emission.

The exemplary embodiment of a lighting device 700 that is shown in FIG. 7 contains a light source, which has a blue semiconductor chip 706 (for example, a light-emitting diode chip) arranged on a substrate 704. A first converter 708 is arranged on the chip 706 and a lens 712 may be mounted or arranged over the first converter 708. A second converter 714 is arranged at least partially around the lens 712 or encloses the lens 712 substantially completely, as shown in the exemplary embodiment represented in FIG. 7. In this exemplary embodiment, the material of the second converter 714 has been applied, for example, molded, in the form of a shell around the lens 712.

Figure 8:
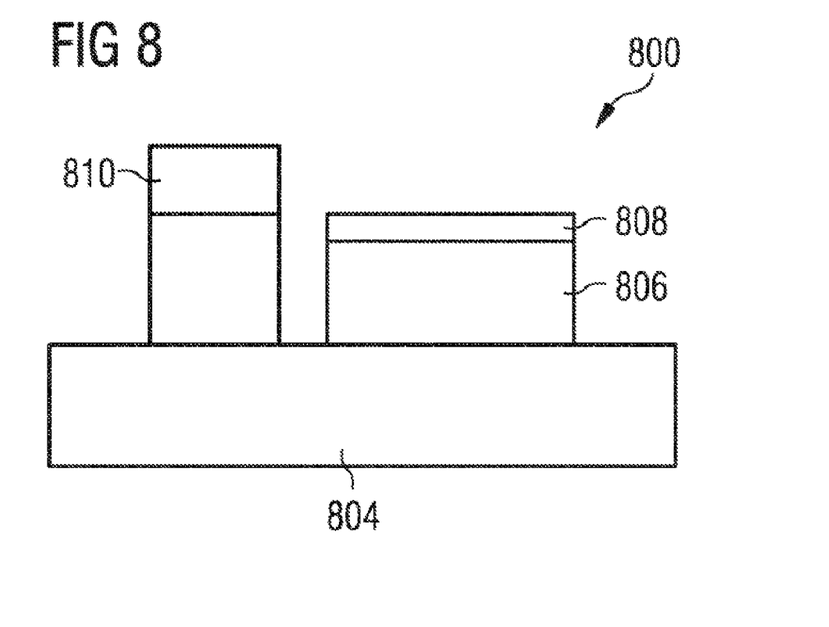
FIG. 8 shows a schematic representation of a cross section of a further exemplary embodiment of a lighting device for generating a light emission.

The exemplary embodiment of a lighting device 800 that is shown in FIG. 8 contains a light source, which has a blue semiconductor chip 806 (for example, a light-emitting diode chip) arranged on a substrate 804. A first converter 808 is arranged on the semiconductor chip 806 and a second converter 810 is arranged on the substrate 804 laterally offset in relation to the semiconductor chip 806. This advantageously makes it possible that the second converter 810 can be cooled effectively. In an exemplary embodiment, the substrate 804 may, for example, consist of silver, which can have a high reflectivity and at the same time can have a good thermal conductivity. Advantageously, the substrate, for example, a silver substrate, may be coupled to a heat sink (for example, of copper) in the underside of the LED package.

In the exemplary embodiments described above with reference to FIG. 5 to FIG. 8, a ceramic substrate may be used, for example, as the substrate (panel). A lens material by way of example is silicone. The substrate may, for example, consist of aluminum oxide, aluminum nitride or yttrium aluminum oxide.

In the exemplary embodiments described, the following materials may be advantageously used, for example, as lens material:

Polyacrylate, polyolefins (for example, high- or low-density polyethylene (PE) or polypropylene (PP)), polyvinylchloride (PVC), polystyrene (PS), polyester, polycarbonate (PC), polyethylene terephthalate (PET), polyether sulfone (PES), polyethylene naphthalate (PEN), polymethyl methacrylate (PMMA), polyimide (PI), polyether ketone (PEEK), polyamides, for example, polyphthalamides (PPA), polycyclohexylene dimethylene terephthalate (PCT), silicones, epoxides or a liquid-crystalline polymer (LCP).

In other exemplary embodiments, the second converter may be formed as a component that is separate from the light source and the first converter. Consequently, the second converter can be used in a so-called remote approach.

The exemplary embodiments are possible in the case of an organic light-emitting diode (OLED) with pumping wavelengths in the blue and white range, for example, with blue and white as the pumping wavelengths for the first converter and then red directly for the red-red conversion of the second converter.

In the exemplary embodiments described, the first converter may, for example, be configured to emit light in a range from approximately 580 nm to approximately 650 nm, for example, with a dominant wavelength less than approximately 610 nm. The light emitted/converted altogether by the lighting device may, for example, have a dominant wavelength in a range from approximately 610 nm to approximately 625 nm. The second converter may, for example, have its absorption maximum at approximately 575 nm. In an exemplary embodiment, the light from the first converter may have a dominant wavelength of approximately 606 nm and the dominant wavelength of the light emitted/converted altogether may be approximately 612 nm.

Figure 9:
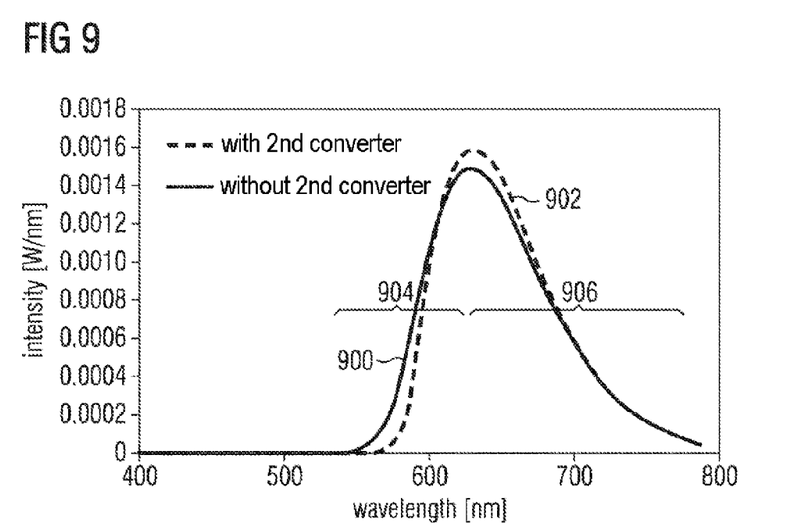
FIG. 9 shows measured spectra of a comparison of a conventional red LED, consisting of a semiconductor chip, which emits blue light, and a converter, which converts this blue light completely into red light, and an exemplary embodiment of a lighting device for generating a light emission.

FIG. 9 shows measured spectra of a comparison of a conventional red LED with full conversion or virtually full conversion by an $Eu^{2+}$-doped converter (curve 900) and an exemplary embodiment of a lighting device with a second converter (curve 902). As is evident from FIG. 9, the second converter may advantageously achieve a red shift of the emission, with at the same time a reduction of the bandwidth. By the second converter, light is absorbed in the short-wave range 904 of the emission 900 and light is emitted in the long-wave range 906 of the emission 900. As a result, both the dominant wavelength and the peak wavelength of the emission 902 are shifted to longwave with respect to the emission 900. Without the second converter (curve 900), the dominant wavelength is approximately 606 nm and the peak wavelength is approximately 627 nm. With the second converter (curve 902), the dominant wavelength is approximately 612 nm and the peak wavelength is approximately 629 nm.

Figure 10:
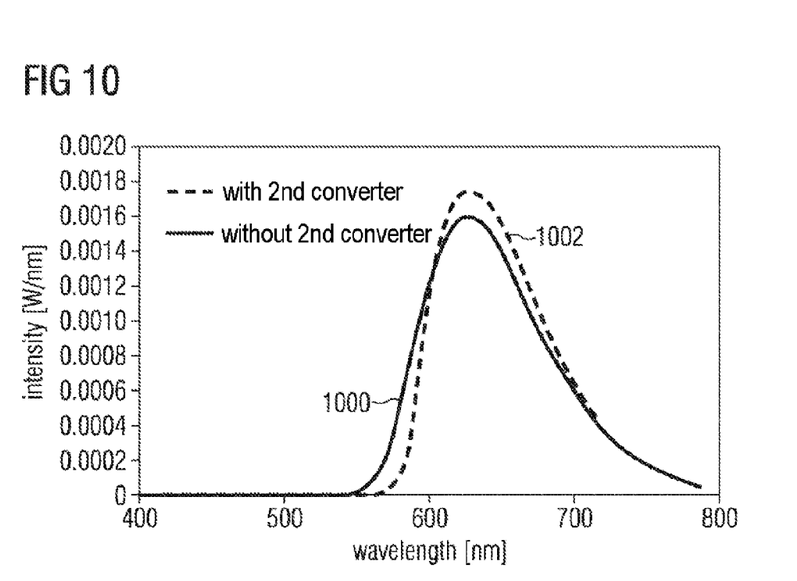
FIG. 10 shows measured spectra of a further comparison of a conventional red LED, consisting of a semiconductor chip, which emits blue light, and a converter, which converts this blue light completely into red light, and an exemplary embodiment of a lighting device for generating a light emission.

FIG. 10 shows measured spectra of a further comparison of a conventional red LED with full conversion or virtually full conversion by an $Eu^{2+}$-doped converter (curve 1000) and an exemplary embodiment of a lighting device with a second converter (curve 1002). In comparison with FIG. 9, the first converter has a lower concentration. The second converter can in turn advantageously achieve a red shift of the emission, with at the same time a reduction of the bandwidth. Without the second converter (curve 1000), the dominant wavelength is approximately 605 nm and the peak wavelength is approximately 619 nm. With the second converter (curve 1002), the dominant wavelength is approximately 611 nm and the peak wavelength is approximately 626 nm.

The $Eu^{2+}$-doped converter in FIG. 9 and FIG. 10 is an $(Sr,Ba,Ca)2Si5N8$ phosphor (preferably with an $Eu^{2+}$ content of approximately 0.5-15% and particularly preferably of approximately 2-8%). In FIG. 9, this has been used in a concentration of approximately 32% phosphor in a volume potting (light path in the package approximately 0.4 mm) and in FIG. 10 with approximately 25% in a volume potting. The second converter is Lumogen red 305 F, obtainable, for example, from BASF. Approximately 4 mg were dissolved in approximately 20 g of silicone. That corresponds to a concentration of approximately 0.1 g/l. Concentrations of approximately 0.001-approximately 0.1 g/l in the case of a light path of approximately 1.5 mm can be used, for example, in various exemplary embodiments.

Figure 11:
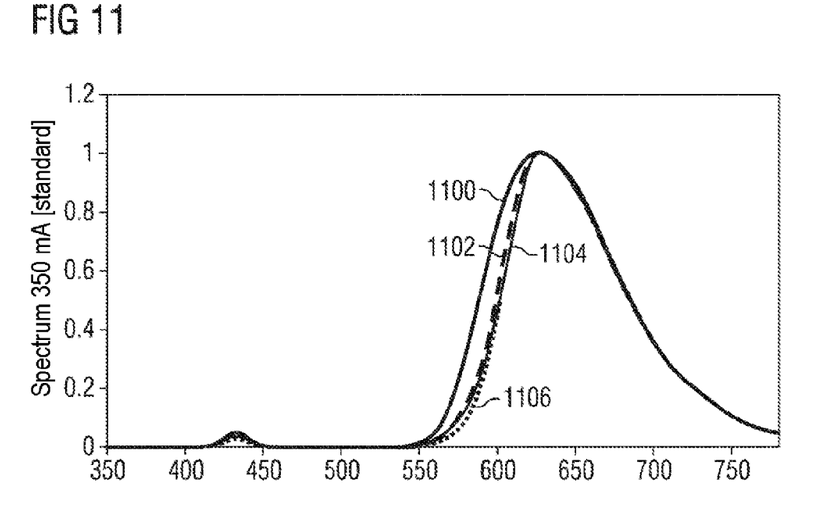
FIG. 11 shows measured spectra of a further comparison of a conventional red LED, consisting of a semiconductor chip, which emits blue light, and a converter, which converts this blue light completely into red light, and exemplary embodiments of a lighting device for generating a light emission.

FIG. 11 shows measured spectra of a further comparison of a conventional red LED with full conversion or virtually full conversion by only one $Eu^{2+}$-doped converter (curve 1100) and exemplary embodiments of a lighting device with a second converter (curves 1102, 1104 and 1106). For the curve 1100, a dominant wavelength of approximately 604 nm was measured, while for the curves 1102, 1104 and 1106 a dominant wavelength of approximately 610 nm, approximately 607 nm and approximately 608 nm was respectively measured.

For the curve 1100, a peak wavelength, that is to say the wavelength with the highest intensity, of approximately 624 nm was measured, while for the curves 1102, 1104 and 1106 a dominant wavelength of approximately 628 nm, approximately 629 nm and approximately 627 nm was respectively measured. The material of the second converter in the exemplary embodiments of the curves 1102, 1104 and 1106 was BASF Lumogen F red 305, with approximately the same layer thicknesses.

Figure 12:
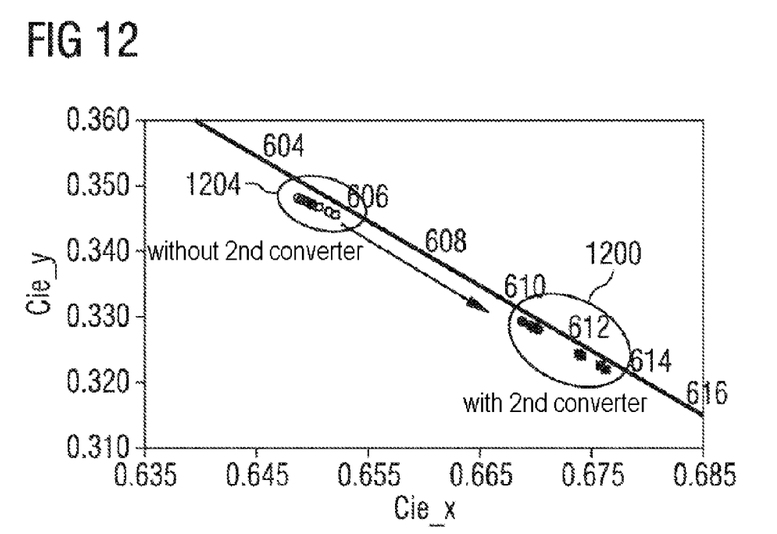
FIG. 12 shows examples of a comparison of shifts in the chromaticity points (chromaticity point shifts) of conventional red LEDs, consisting of a semiconductor chip, which emits blue light, and a converter, which converts this blue light completely into red light, and exemplary embodiments of a lighting device for generating a light emission.

FIG. 12 shows examples of a comparison of chromaticity point shifts of conventional red LEDs with full conversion or virtually full conversion by only one converter and exemplary embodiments of a lighting device with a second converter.

Figure 13:
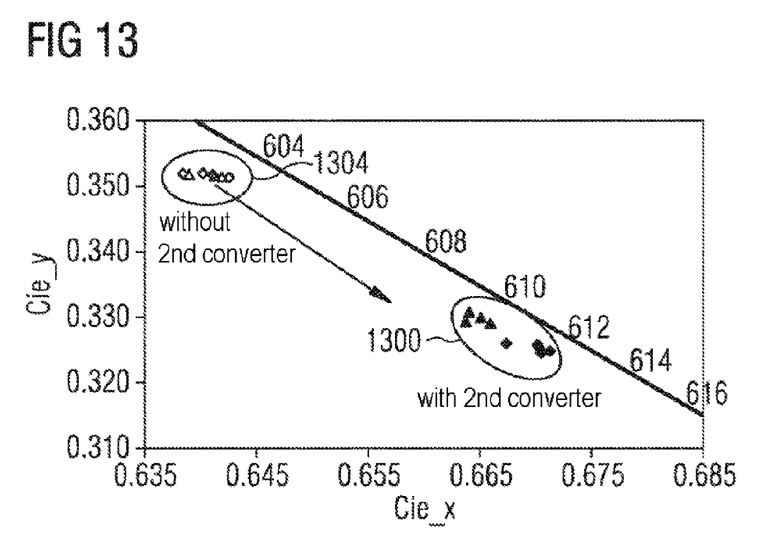
FIG. 13 shows examples of a comparison of shifts in the chromaticity points (chromaticity point shifts) of conventional red LEDs, consisting of a semiconductor chip, which emits blue light, and a converter, which converts this blue light completely into red light, and exemplary embodiments of a lighting device for generating a light emission.

FIG. 13 shows examples of a further comparison of chromaticity point shifts of conventional red LEDs with full conversion or virtually full conversion by only one converter and exemplary embodiments of a lighting device with a second converter. In comparison with FIG. 12, the first converter has in these examples a lower concentration.

Figure 14:
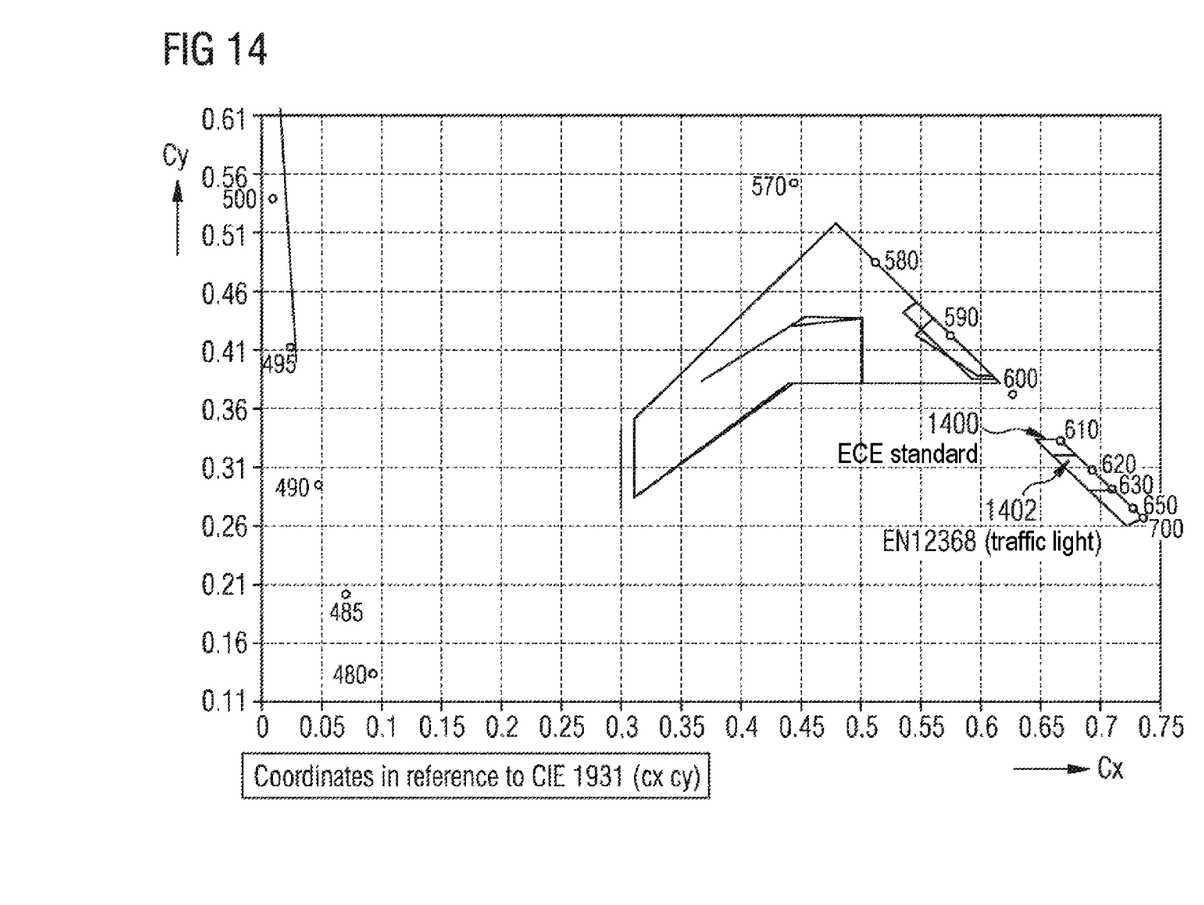
FIG. 14 shows a chromaticity diagram, in which the ECE standard and EN12368 (traffic light standard) are presented.

As can be seen from a comparison of FIGS. 12 and 13 with FIG. 14, the measured values of the exemplary embodiments, indicated as groups 1200 and 1300 in FIGS. 12 and 13, both fall within a traffic light standard 1400 (EN12368) and the ECE standard 1402. By contrast, the measured values of the LEDs with only one converter, indicated as groups 1204 and 1304 in FIGS. 12 and 13, do not achieve the traffic light standard 1400 and the ECE standard 1402.

The exemplary embodiments described may advantageously have one or more of the following effects:

A converted spectrum with a dominant wavelength in a range from approximately 615 nm to approximately 625 nm can be obtained.

By the second conversion of low-energy photons (red), materials that would not have the necessary stability in the customary conversion of blue light can be used for the conversion (such as, for example, organic converters and semiconductor nanoparticles). These materials can be obtained in particle sizes well below the wavelength of visible light, and consequently further scattering losses do not occur.

The first converter emits at a shorter wavelength than is necessary without a second conversion. As a result, there is less emission in the infrared range.

A converted spectrum with a dominant wavelength in a range from approximately 615 nm to approximately 625 nm can be obtained.

A higher overall efficiency can be achieved than, for example, with a single-phosphor system.

The spectrum becomes narrower, and as a result a better color saturation is achieved.

A purer shade of red is obtained.

A material-system-dependent chromaticity point shift with increasing temperature can be compensated, or at least minimized, by the second converter. Some converters, such as, for example, phosphors, shift with higher temperatures in the direction of yellow. Furthermore, at higher temperatures, conversion is not as great. By the second converter, for example, phosphor, the yellow shift can be arrested, since more light is absorbed and converted back into red. Furthermore, the strong remains of blue light occurring can be absorbed by the second converter. Otherwise, the desired color range would be abandoned at high temperatures.

Possible, but not restrictive, materials for the first converter in the exemplary embodiments described are $Eu^{2+}$-doped converters, such as, for example, $Eu^{2+}$-doped nitrides, for example, $CaAlSiN3:Eu^{2+}$, $(Ba, Sr)2Si5N8:Eu^{2+}$; $Eu^{2+}$-doped sulfides; $Eu^{2+}$-doped SiAlONe and SiONe.

Possible, but not restrictive, materials for the second converter in the exemplary embodiments described are organic dyes and luminescent dyes, for example, the following substance classes: acridine dyes, acridinone dyes, anthraquino dyes, anthracene dyes, cyanine dyes, dansyl dyes, squaryllium dyes, spiropyrans, boron-dipyrromethenes (BODIPY), perylenes, pyrenes, naphthalenes, flavins, pyrroles, porphyrins and the metal complexes thereof, diarylmethane dyes, triarylmethane dyes, nitro and nitroso dyes, phthalocyanine dyes and metal complexes of phthalocyanines, quinones, azo dyes, indophenol dyes, oxazines, oxazones, thiazines and thiazoles, xanthenes, fluorenes, flurones, pyronines, rhodamines, coumarins.

Advantageous organic materials are, for example, perylene imides and perylene carboxylates.

The invention is not restricted by the description on the basis of the exemplary embodiments to these embodiments. Rather, the invention comprises every novel feature and every combination of features, which includes in particular any combination of features in the patent claims, even if this feature or this combination itself is not explicitly specified in the patent claims or exemplary embodiments.

The invention claimed is:

1. A lighting device for generating a light emission, the lighting device comprising:
    a light source configured to generate light with a first dominant wavelength, wherein the light source comprises a chip;
    a first converter configured to absorb the light generated by the light source and emit light with a second dominant wavelength, which is greater than the first dominant wavelength, wherein the second dominant wavelength is less than 610 nm; and
    a second converter configured to absorb a light component of the light emitted by the first converter and emit light such that the light emission has a third dominant wavelength, which is greater than the second dominant wavelength, wherein the second converter comprises an organic phosphor,
    wherein the second converter comprises a particle size that is smaller than the second dominant wavelength,
    wherein the first converter is arranged directly on the chip and the second converter is arranged directly on the first converter,
    wherein substantially no radiation of the light with the first dominant wavelength impinges on the second converter, and
    wherein at least 95% of the light with the first dominant wavelength is converted by the first converter.

2. The lighting device according to claim 1, wherein the first dominant wavelength lies in a spectral range of blue light, the first converter fully converts the light of the light source into yellowy-red light, and wherein the second converter emits light in a long-wave range of the first converter or in an infrared range, the first converter and the second converter comprising different phosphors.

3. The lighting device according to claim 1, wherein the light component contains up to 30% of a light output of the first converter.

4. The lighting device according to claim 1, wherein the second converter is configured to emit light with a fourth dominant wavelength, which is greater than the second dominant wavelength.

5. The lighting device according to claim 1, wherein the second converter is configured to absorb the light component of the light emitted by the first converter and emit light such that the light emission has a greater peak wavelength in comparison with the light emitted by the first converter.

6. The lighting device according to claim 1, further comprising a lens, wherein the second converter is contained in the lens of the lighting device or is arranged at least partially around the lens of the lighting device.

7. The lighting device according to claim 1, wherein the light source has a light-emitting diode component with a package, the package having a cavity for receiving the second converter.

8. The lighting device according to claim 7, wherein the second converter is contained in a matrix material, which is accommodated in the cavity.

9. The lighting device according to claim 1, wherein the chip is arranged on a substrate.

10. The lighting device according to claim 1, wherein the third dominant wavelength is in a range from 615 nm to 625 nm.

11. A method for generating a light emission, the method comprising:
    generating light with a first dominant wavelength by a light source comprising a chip;
    absorbing the generated light and emitting light with a second dominant wavelength, which is greater than the first dominant wavelength, by a first converter, wherein the second dominant wavelength is less than 610 nm; and
    absorbing a light component of the light emitted by the first converter and emitting light by a second converter such that the light emission has a third dominant wavelength, which is greater than the second dominant wavelength, wherein the second converter comprises an organic phosphor,
    wherein the second converter comprises a particle size that is smaller than the second dominant wavelength,
    wherein the first converter is arranged directly on the chip and the second converter is arranged directly on the first converter, wherein substantially no radiation of the light with the first dominant wavelength impinges on the second converter, and wherein at least 95% of the light with the first dominant wavelength is converted by the first converter.

12. The method according to claim 11, wherein the light component contains up to 30% of a light output by the first converter.

13. The method according to claim 1, wherein the light emitted by the second converter has a fourth dominant wavelength, which is greater than the second dominant wavelength.

14. The method according to claim 11, wherein the third dominant wavelength is in a range from 615 nm to 625 nm.

15. A lighting device for generating a light emission, the lighting device comprising:
   a light source configured to generate light with a first dominant wavelength, wherein the light source comprises a chip;
   a first converter configured to absorb the light generated by the light source and emit light with a second dominant wavelength, which is greater than the first dominant wavelength; and
   a second converter configured to absorb a light component of the light emitted by the first converter and emit light such that the light emission has a third dominant wavelength, which is greater than the second dominant wavelength, wherein the second converter comprises an organic phosphor,
   wherein the second converter comprises a particle size that is smaller than the second dominant wavelength,
   wherein the first converter is arranged directly on the chip and the second converter is arranged directly on the first converter,
   wherein the first dominant wavelength lies in a spectral range of blue light,
   wherein the first converter fully converts the light of the light source into yellowy-red light with wavelengths of between at least 580 nm and less than 610 nm,
   wherein the second converter emits light in a long-wave range of the first converter or in an infrared range,
   wherein substantially no radiation of the light with the first dominant wavelength impinges on the second converter, and
   wherein the first converter and the second converter comprise different phosphors.

* * * * *